United States Patent
Patti et al.

(10) Patent No.: US 7,126,167 B2
(45) Date of Patent: Oct. 24, 2006

(54) MONOLITHICALLY INTEGRATED RESISTIVE STRUCTURE WITH POWER IGBT (INSULATED GATE BIPOLAR TRANSISTOR) DEVICES

(75) Inventors: Davide Patti, Catania (IT); Antonino Torres, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 201 days.

(21) Appl. No.: 10/888,789

(22) Filed: Jul. 9, 2004

(65) Prior Publication Data

US 2005/0051813 A1 Mar. 10, 2005

(30) Foreign Application Priority Data

Jul. 11, 2003 (IT) .......................... MI2003A1426

(51) Int. Cl.
*H01L 29/43* (2006.01)

(52) U.S. Cl. .................. 257/139; 257/140; 257/565; 257/566

(58) Field of Classification Search ................ 257/565, 257/566, 575, 577, 139, 140
See application file for complete search history.

(56) References Cited

U.S. PATENT DOCUMENTS

| 6,137,124 | A  | * | 10/2000 | Michel et al. | ............... | 257/263 |
| 6,190,970 | B1 | * | 2/2001  | Liao et al.   | ................... | 438/269 |
| 6,727,526 | B1 | * | 4/2004  | Niedernostheide et al. | . | 257/107 |
| 6,847,058 | B1 | * | 1/2005  | Ishizaka et al. | ............. | 257/133 |
| 6,936,866 | B1 | * | 8/2005  | Deboy et al.  | ................ | 257/135 |
| 2004/0070050 | A1 | * | 4/2004 | Chi | ............................ | 257/536 |

* cited by examiner

*Primary Examiner*—Wael Fahmy
*Assistant Examiner*—Mursalin B. Hafiz
(74) *Attorney, Agent, or Firm*—Lisa K. Jorgenson; Hai Han; Seed IP Law Group PLLC

(57) ABSTRACT

A device integrated in a semiconductor substrate of a first type of conductivity being crowned by a semiconductor layer of a second type of conductivity comprising a voltage controlled resistive structure and an IGBT device, wherein the resistive structure comprises at least one substantially annular region of the first type of conductivity which surrounds a portion of the semiconductor layer.

20 Claims, 2 Drawing Sheets

MONOLITHICALLY INTEGRATED RESISTIVE STRUCTURE WITH POWER IGBT (INSULATED GATE BIPOLAR TRANSISTOR) DEVICES

BACKGROUND OF THE INVENTION

1. Field of the Invention

The present invention relates to a monolithically integrated resistive structure with power IGBT (Insulated Gate Bipolar Transistor) devices.

More specifically, the invention relates to a device being integrated on a semiconductor substrate of a first type of conductivity crowned by a semiconductor layer of a second type of conductivity comprising a voltage controlled resistive structure and an IGBT device and a method of manufacture thereof.

2. Description of the Related Art

As it is known, high voltage resistors integrated on a semiconductor material substrate or chip are widely used in the field of monolithically integrated power devices, for example, of devices manufactured with VIPower technology, according to which power devices are integrated in a first region of the chip, called the power region, whereas the relevant control devices are integrated in a second region of the same chip, called the control region, being distinct and electrically insulated from the power region.

Moreover, in other applications, it is also necessary to provide, inside the control region, a biasing voltage derived from a biasing voltage of the substrate by means of a divider realized by using a resistor connected between the substrate and the control region. However, in order for this resistor to be able to withstand the high values the substrate biasing voltage can reach, as it is known (up to 2 kV), it needs to have fairly high resistance values, which generally is 100 kΩ or higher so as to limit the power dissipation given by $P=R*I^2$, P being the dissipated power value, R the resistance value of the resistor and I the current flowing in the resistor.

A prior art solution for manufacturing a resistor having the above cited resistance values provides the integration in a semiconductor substrate of a high resistant doped region having an opposite conductivity with respect to that of the substrate itself.

Although advantageous in several aspects, this solution has various drawbacks when a resistive structure has to be integrated in a semiconductor substrate made for integrating devices of the IGBT type as it is shown in FIG. 1.

In particular, in the case of IGBT applications, on a semiconductor substrate 1, which comprises a first region 2 of the P+type and a second region 3 of the N type, a highly resistant doped region 4 is integrated having an opposite conductivity with respect to that of the second region 3 of the N type whereon it is integrated. This doped region 4 has a planar configuration and possibly it can also be serpentine-like and it comprises a high voltage resistor 5.

The final device 14 thus comprises an insulating layer 6, deposited on the second region 3, whereon openings 7 are formed for performing the electrical connection with a metal layer 8 formed on the insulating layer 6. The final device 14 is thus completed by forming a substrate electrode 9 on the back of the semiconductor substrate 1.

As it is shown in the figure, the presence of the high voltage resistor 5 forms a PNP parasite transistor 10 whereon emitter and collector terminals 11 and 12 are respectively connected to the first region 2 and the doped region 4, whereas the base terminal 13 is connected to the second region 3.

Accordingly, there remains a need in the art to provide a monolithically integrated high voltage resistive structure with IGBT devices, having such structural and functional characteristics so as to avoid the growth of parasite transistors and to overcome the limits and drawbacks that still affect the devices realised according to the prior art.

BRIEF SUMMARY OF THE INVENTION

One embodiment of the present invention provides a resistive structure in a same semiconductor layer wherein the device of the IGBT type is integrated, the resistive structure comprising an annular region formed in this semiconductor layer and having a different conductivity with respect to that of the semiconductor layer itself.

Advantageously, a side portion of this annular region forms a body region of the IGBT device.

A further embodiment of the invention provides a method for manufacturing a device integrated on a semiconductor substrate of a first type of conductivity comprising a resistive structure and an IGBT device, comprising, forming a semiconductor layer of a second type of conductivity on said semiconductor substrate, and forming a substantially annular region of the first type of conductivity which surrounds a portion of said semiconductor layer to provide said resistive structure.

The characteristics and advantages of the device and of the method according to the invention will be apparent from the following description of an embodiment thereof given by way of indicative and non limiting example with reference to the annexed drawings.

DETAILED DESCRIPTION OF THE INVENTION

With reference to these drawings, a monolithically integrated resistive structure with a power IGBT (Insulated Gate Bipolar Transistor) device is described.

Figure 1:
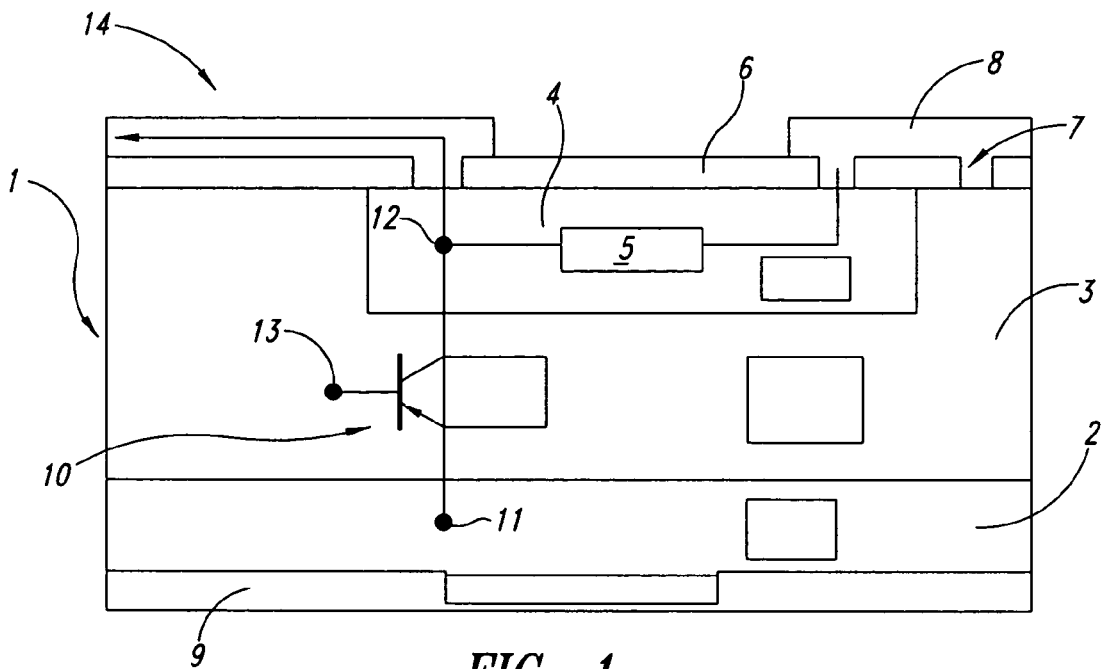
FIG. 1 is a section schematic view of a semiconductor substrate portion wherein a resistive structure according to the prior art is integrated.
Figure 2:
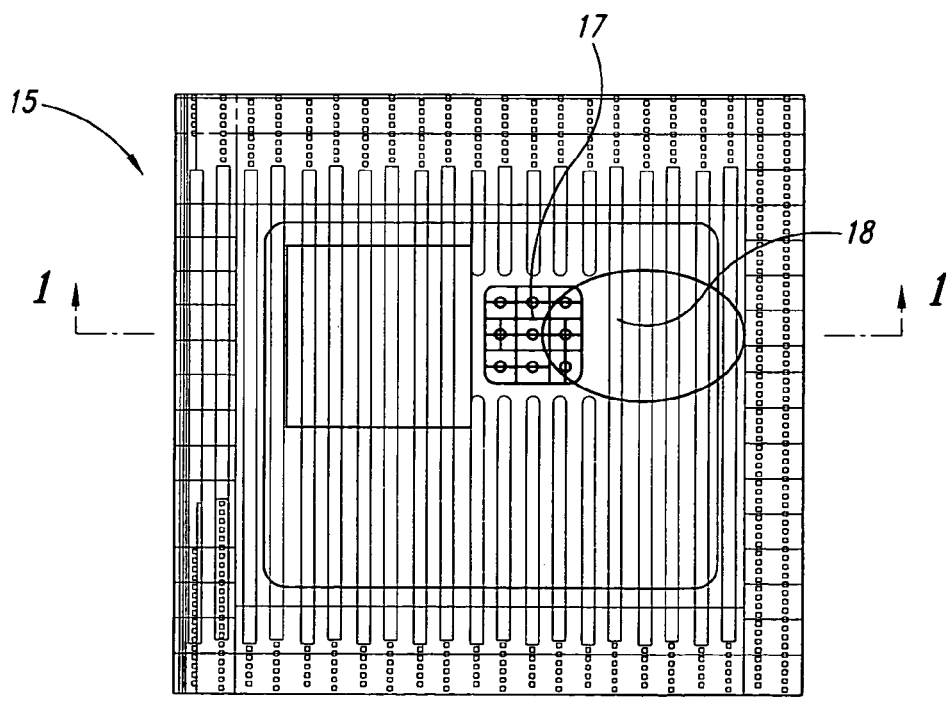
FIG. 2 is a plane section view of a semiconductor substrate portion wherein a resistive structure is integrated according to one embodiment of the present invention.
Figure 3:
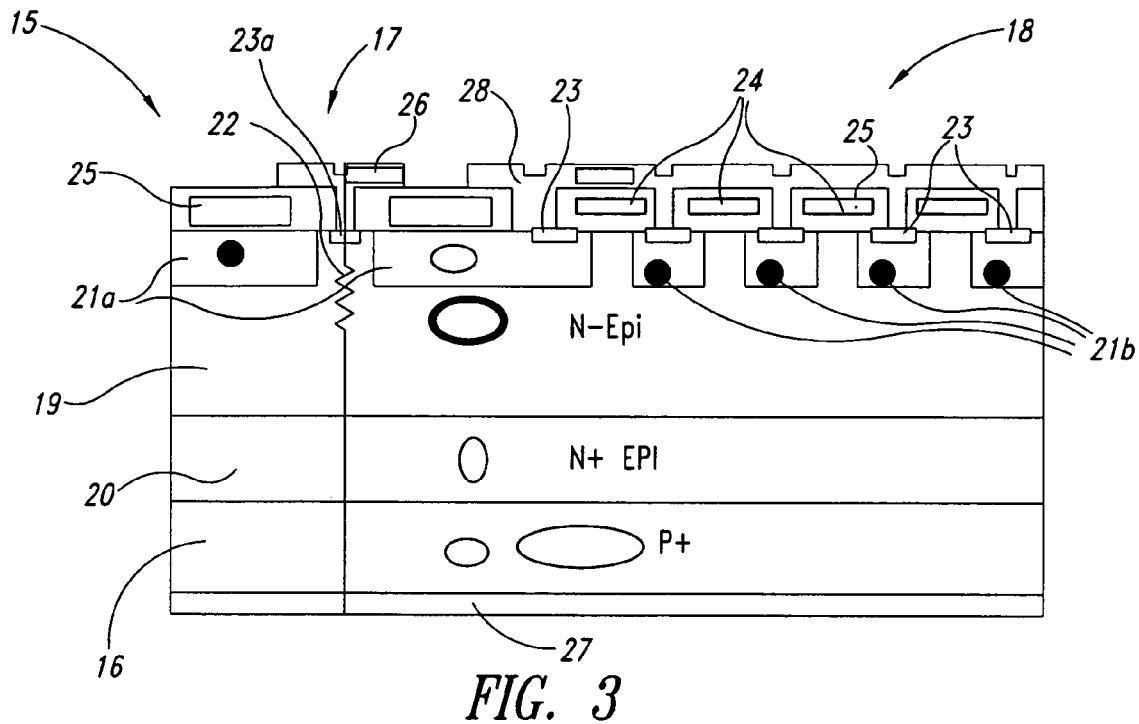
FIG. 3 is a section schematic view along the I—I line of a semiconductor substrate portion of FIG. 2 wherein the resistive structure is integrated according to one embodiment of the present invention.

In particular, with reference to FIGS. 2 and 3 a device is globally indicated with 15, this device being integrated on a semiconductor substrate 16, for example of the P+type, and comprising a resistive structure 17 and, by way of mere non limiting-example, a power IGBT transistor 18 having vertical structure.

In particular, the resistive structure 17 is integrated on a first semiconductor layer 19, for example, of the N–type, which is formed on the semiconductor substrate 16. The first semiconductor layer 19 is advantageously an epitaxial layer.

Advantageously, a second semiconductor layer 20 is present between the first semiconductor layer 19 of the N-type and the semiconductor substrate 16. The second semiconductor layer 20 is also, for example, an epitaxial layer of the N+type.

The resistive structure 17 according to the invention comprises a closed region 21a, for example of the annular type, of the P+type. The annular region 21a surrounds a portion 22 of the first epitaxial layer 19 thus allowing the surround portion 22 to be laterally insulated from the region 21a.

As shown in FIG. 2, a plurality of regions 21a can be formed adjacent one another and parallelly connected in order to obtain a less resistive structure 17. Thanks to this parallel configuration of the resistive structure 17 it is possible to fix resistive values with low tolerances.

In a preferred embodiment these resistive structures 17 are matrix arranged.

Advantageously, the device 15 comprises a transistor IGBT 18 formed by a vertical transistor MOS which drives a bipolar transistor. The conductive electrodes of the bipolar transistor are formed by the semiconductor substrate 16 and by a region 21b. Region 21b, for example, of the P type, called a body region, can be formed in the first epitaxial layer 19, whereas the driving terminal is formed by the first epitaxial layer 19 itself.

The vertical MOS transistor comprises the body region 21b wherein a source region 23 is integrated, for example of the N type. A gate region 24, insulated from the first semiconductor layer 19 by means of an insulating layer 25, completes the IGBT transistor 18.

Advantageously, a side portion of the annular region 21a, wherein a source region 23 is integrated, can be used as body region 21b for the IGBT transistor.

The resistive structure 17 is thus provided with an upper electrode 26 which contacts the portion 22 of the first semiconductor layer 19, the upper electrode 26 being insulated from the portion 21a with the first semiconductor layer 19 arranged on the back of the semiconductor substrate 16.

The lower electrode 27 also forms a first output electrode of the IGBT device 18, whereas a further electrode 28 which contacts the source regions 23 and which is insulated from the gate regions 24 by means of an insulating layer 25, forms a second output electrode of the IGBT device 18.

The method for manufacturing the integrated device 15 is now described, the device comprising the resistive structure 17 and the power transistor 18 according to the invention. In particular, on a monocrystalline silicon semiconductor substrate 16 with high doping impurity concentration of the P+type, a first epitaxial layer 19 is formed having a thickness and an impurity concentration chosen according to the highest voltage the integrated device 15 must be able to withstand; typically, the concentration of the impurities being present in the first epitaxial layer 19 varies between $10^{13}$ and $10^{14}$ atoms/cm$^3$, whereas the thickness of the first epitaxial layer 19 is generally between 50 and 80 μm.

Advantageously, a second epitaxial layer 20 with higher concentration of the doping impurity of the same type as in 19 (e.g., N type) is formed between the first epitaxial layer 19 and the semiconductor substrate 16. On the epitaxial layer 19 a plurality of regions 21 of the P+type is thus formed by ionic implantation and subsequent diffusion process. In particular, an annular-shaped first region 21a surrounding a portion 22 of the epitaxial layer 19 is formed. According to the invention, the first region 21a and the surrounded portion 22 form the resistive structure 17.

On the epitaxial layer 19 a plurality of second regions 21b are further realised which form a plurality of body regions, interconnected with each other, of a single IGBT transistor 18. In fact the IGBT transistor 18 described in the figures by way of non-limiting example is formed with cells being interconnected with each other according to a mesh.

Nothing forbids the resistive structure 17 according to the invention to be formed together with a conventional IGBT device 18.

The IGBT device 18 is completed through conventional steps which provide processes of deposition, photolithography and diffusion for forming source regions 23 of the N+type inside the body regions 21b.

Advantageously, a region 23a of the N+type is formed inside the portion 22 contained by the P+ring 21a in order to form a surface contact with low resistivity of the portion 22 of the resistive structure 17.

After having deposited an insulating layer 24 throughout the surface of the device 15, gate electrodes 24 of the IGBT transistor 18 are formed inside this insulating layer 24.

After having formed openings in correspondence of the source regions 23 and of the region 22, through known processes of deposition and photolithography, an upper electrode 26 of the resistive structure 17 and an output electrode 28 of the IGBT transistor 18 are formed.

The device 15 is thus completed by forming an electrode 27 on the back of the device, to provide the lower electrode of the resistive structure 17 and simultaneously another output electrode of the IGBT transistor 18.

Finally, the resistive structure 17 according to the invention has a totally vertical structure and current flux, a resistance which is a function of the volume of semiconductor material surrounded by the annular region 21a, and an electrical behaviour which is a function of the depth of the annular region 21a. In particular, the resistance value of the resistive structure 17 depends on the voltage applied to the portion 22 and to the annular region 21a, and the resistive structure thus obtained acts as a resistive structure being voltage controlled. In one embodiment wherein a portion of the annular region 21a is used as body region of the IGBT transistor 18, the voltage of the annular region 21a is kept fixed whereas the voltage applied to the portion 22 is changed. In this way, by integrating the resistive structure 17 with the IGBT transistor 18, the biasing of the IGBT transistor 18 itself is not altered and, by applying a voltage different from zero to the portion 22 it is possible to obtain different resistance values across the resistive structure 17 according to the invention.

Figure 4:
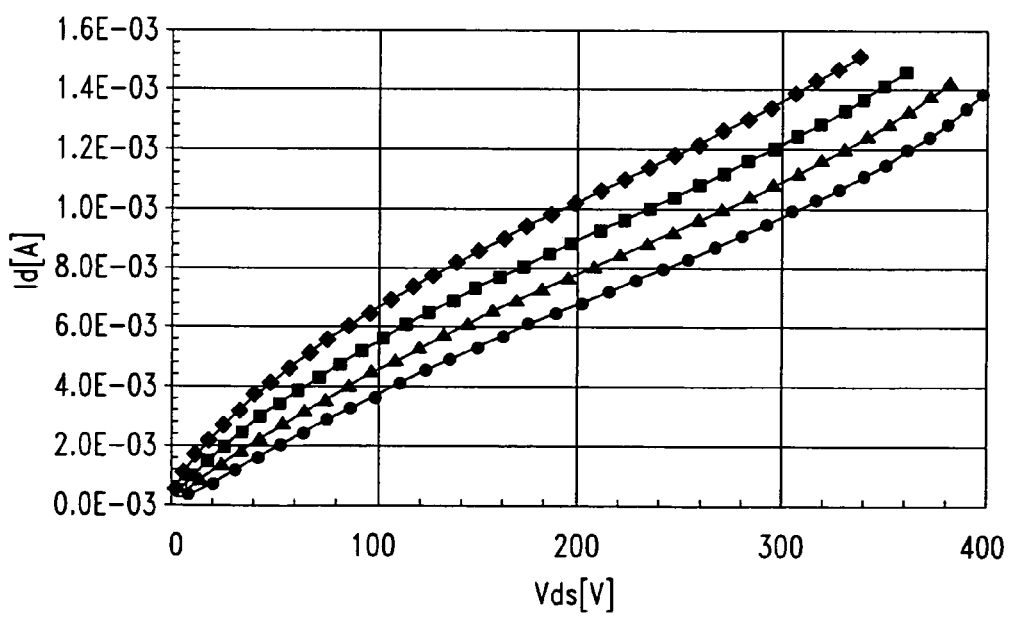
FIG. 4 is a current voltage diagram of the resistive structure according to the invention when the biasing applied to the resistive structure varies.

FIG. 4 particularly shows the different resistance values being achievable across the resistive structure 17 when the voltage applied to the portion 22 varies.

In conclusion, the device 15 according to the invention allows for the integration of a resistive structure of minimum space in terms of silicon area used, with total freedom of arrangement inside a conventional IGBT structure, at the same time, eliminates the parasite effects which would jeopardise or limit the electrical characteristics.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. An integrated device comprising:
   a semiconductor substrate of a first type of conductivity;
   a first semiconductor layer of a second type of conductivity crowning the substrate,
   an IGBT device; and
   a voltage-controlled resistive structure, wherein said resistive structure comprises a substantially annular region of the first type of conductivity which surrounds a portion of said semiconductor layer.

2. The integrated device according to claim 1, wherein said resistive structure comprises a plurality of substantially annular regions being matrix arranged in said semiconductor layer.

3. The integrated device according to claim 1, wherein said first type of conductivity is of the P type.

4. The integrated device according to claim 1, wherein said second type of conductivity is of the N type.

5. The integrated device according to claim 1 wherein a second semiconductor layer of the second type of conductivity is formed between the substrate and the first semiconductor layer.

6. The integrated device according to claim 1 wherein the IGBT device includes a bipolar transistor and a vertical MOS transistor which drives the bipolar transistor.

7. The integrated device according to claim 6 further comprises a body region of the first conductivity type, said body region being formed in the first semiconductor layer.

8. The integrated device according to claim 1, further comprising a source region having high concentration of the second type of conductivity in said surrounded portion of said semiconductor layer.

9. The integrated device according to claim 8, wherein a side portion of said substantially annular region integrated with said source region is a body region of said IGBT transistor.

10. The integrated device according to claim 8, wherein said resistive structure is provided with an upper output electrode which contacts said region having high concentration and a lower output electrode electrically coupled with a back of said semiconductor layer.

11. An integrated device having a resistive structure and an IGBT transistor, comprising:
   a semiconductor substrate of a first type of conductivity;
   a first semiconductor layer of a second type of conductivity on said semiconductor substrate; and
   a plurality of regions of the first type of conductivity in said first semiconductor layer, said regions comprise a first region of substantially annular shape and a second region, wherein the first region and a portion of the first semiconductor layer surrounded by the first region form the resistive structure, and wherein the second region forms a body region of the IGBT transistor.

12. The integrated device according to claim 11 further comprising a second semiconductor layer of the second type of conductivity between said semiconductor substrate and said first semiconductor layer.

13. The integrated device according to claim 11 wherein the first type of conductivity is P type and the second type of conductivity is N type.

14. The integrated device according to claim 11 wherein a plurality of the first regions are formed and parallelly connected to each other.

15. The integrated device according to claim 11 wherein a plurality of the second regions are formed and interconnected with each other.

16. An integrated device, comprising:
   a semiconductor substrate of a first conductivity type, the substrate being a first conductive region of an insulated gate bipolar transistor;
   a first semiconductor layer of a second conductivity type on said semiconductor substrate, the first semiconductor layer being a driving terminal of the transistor; and
   a surrounding region of the first conductivity type in said first semiconductor layer, said region completely laterally surrounding a portion of the first semiconductor layer, the surrounding region and the surrounded portion of the first semiconductor layer being a resistive structure.

17. The integrated device according to claim 16, further comprising a plurality of body regions of first conductivity type arranged in the semiconductor layer.

18. The integrated device according to claim 16, further comprising a source region having the second conductivity type in said surrounded portion of said semiconductor layer.

19. The integrated device according to claim 18, wherein a side portion of the surrounding region is a body region of the transistor.

20. The integrated device according to claim 18, further comprising:
   an upper output electrode contacting the source region; and
   a lower output electrode contacting the substrate.

* * * * *